US009056424B2

(12) United States Patent
Wenxu et al.

(10) Patent No.: US 9,056,424 B2
(45) Date of Patent: Jun. 16, 2015

(54) METHODS OF TRANSFERRING GRAPHENE AND MANUFACTURING DEVICE USING THE SAME

(71) Applicant: Samsung Electronics Co., Ltd., Suwon-Si, Gyeonggi-Do (KR)

(72) Inventors: Xianyu Wenxu, Suwon-si (KR); Jeong-yub Lee, Seoul (KR); Chang-youl Moon, Suwon-si (KR); Yong-young Park, Daejeon (KR); Woo-young Yang, Hwaseong-si (KR); Yong-sung Kim, Namyangju-si (KR); Joo-ho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 13/918,066

(22) Filed: Jun. 14, 2013

(65) Prior Publication Data
US 2014/0174640 A1 Jun. 26, 2014

(30) Foreign Application Priority Data

Dec. 20, 2012 (KR) ........................ 10-2012-0149834

(51) Int. Cl.
*B44C 1/17* (2006.01)
*B29C 65/16* (2006.01)
*B32B 37/26* (2006.01)
*B32B 38/10* (2006.01)
*B32B 43/00* (2006.01)
*B29C 67/24* (2006.01)
*H01L 51/00* (2006.01)

(Continued)

(52) U.S. Cl.
CPC ............ *B29C 67/24* (2013.01); *H01L 51/0023* (2013.01); *H01L 51/0045* (2013.01); *H01L 51/102* (2013.01); *H01L 51/442* (2013.01); *Y02E 10/549* (2013.01)

(58) Field of Classification Search
CPC ............ B41M 5/42; B41M 5/52; B32B 7/06; B32B 37/025; B32B 37/12; B32B 38/10; Y02E 10/549; H01L 21/6835; H01L 31/00; H01L 51/0023; H01L 51/0045; H01L 51/102; H01L 51/442; B29C 65/48; B29C 67/24
USPC .................. 156/230, 234, 238–241, 247, 249
See application file for complete search history.

(56) References Cited

U.S. PATENT DOCUMENTS 6,071,795 A * 6/2000 Cheung et al. ................ 438/458
6,455,340 B1 9/2002 Chua et al.
(Continued)

FOREIGN PATENT DOCUMENTS

KR 20100008656 A 1/2010
KR 10-2011-0031864 A * 2/2011 .............. C01B 31/02
(Continued)

OTHER PUBLICATIONS

Machine translation of KR 10-2011-0031864 (Oct. 3, 2014).*

*Primary Examiner* — Sing P Chan
(74) *Attorney, Agent, or Firm* — Harness, Dickey & Pierce, P.L.C.

(57) ABSTRACT

A method of transferring graphene includes forming a sacrificial layer and a graphene layer sequentially on a first substrate, bonding the graphene layer to a target layer, and removing the sacrificial layer using a laser and separating the first substrate from the graphene layer.

20 Claims, 5 Drawing Sheets

(51) Int. Cl.
*H01L 51/10* (2006.01)
*H01L 51/44* (2006.01)

(56) References Cited

U.S. PATENT DOCUMENTS

| | | | |
|---|---|---|---|
| 7,202,141 B2 | 4/2007 | Park et al. | |
| 7,241,667 B2 | 7/2007 | Park et al. | |
| 7,294,521 B2 | 11/2007 | Yoo | |
| 7,384,807 B2 | 6/2008 | Yoo | |
| 7,442,569 B2 | 10/2008 | Lee et al. | |
| 7,465,592 B2 | 12/2008 | Yoo | |
| 7,695,989 B2 | 4/2010 | Baik et al. | |
| 7,776,637 B2 | 8/2010 | Leem | |
| 7,781,242 B1 | 8/2010 | Chen et al. | |
| 7,781,247 B2 | 8/2010 | Tran | |
| 7,846,847 B2 | 12/2010 | Park et al. | |
| 7,897,423 B2 | 3/2011 | Hahn et al. | |
| 7,977,133 B2 | 7/2011 | Yoo | |
| 8,026,155 B2 | 9/2011 | Kusuura | |
| 8,030,102 B2 | 10/2011 | Lai | |
| 8,071,401 B2 | 12/2011 | Chen et al. | |
| 8,106,417 B2 | 1/2012 | Yoo | |
| 8,183,589 B2 | 5/2012 | Jeong | |
| 8,637,346 B1 * | 1/2014 | Jung et al. | 438/99 |
| 2013/0082241 A1 * | 4/2013 | Kub et al. | 257/21 |

FOREIGN PATENT DOCUMENTS

| | | | |
|---|---|---|---|
| KR | 20110042023 A | 4/2011 | |
| KR | 20120013604 A | 2/2012 | |
| KR | 101120140 B1 | 3/2012 | |

* cited by examiner

METHODS OF TRANSFERRING GRAPHENE AND MANUFACTURING DEVICE USING THE SAME

CROSS-REFERENCE TO RELATED APPLICATIONS

This application claims the benefit of Korean Patent Application No. 10-2012-0149834, filed on Dec. 20, 2012, in the Korean Intellectual Property Office, the disclosure of which is incorporated herein in its entirety by reference.

BACKGROUND

1. Field

Example embodiments relate to methods of transferring graphene and manufacturing a device using the same.

A. 2. Description of the Related Art

Graphene has a hexagonal structure formed of carbon atoms and may have structural/chemical stability, and exhibit improved electrical and physical characteristics. For example, graphene has a charge mobility of less than about $2\times10^5$ cm$^2$/Vs, which is 100 times or more faster than that of silicon, and a current density of about $10^8$ A/cm$^2$, which is 100 times or more greater than that of Cu. Also, graphene has transmittance and may exhibit quantum characteristics at room temperature. Graphene is attracting attention as a next generation material capable of overcoming the limitations of related art materials.

However, manufacturing a device including graphene is difficult in practice due to the limitations in graphene preparing processes. Forming a hybrid structure that is formed of various materials including graphene and organic materials may be difficult in a graphene transferring method of the related art.

Furthermore, in transferring graphene onto a predetermined or given substrate, because a systematic study has not yet been performed regarding the transfer characteristic of graphene, factors for adjusting/improving the transfer characteristic of graphene are not completely known.

SUMMARY

Example embodiments provide methods of transferring graphene to improve the transfer characteristics of graphene. Example embodiments also provide methods of transferring graphene onto an insulating layer. Example embodiments also provide methods of transferring large-area graphene using a laser.

Example embodiments also provide methods of transferring graphene where a catalyst layer is more easily removed by exposing a surface of the catalyst layer using a laser. Example embodiments also provide methods of manufacturing a device using the methods of transferring graphene.

Additional aspects will be set forth in part in the description which follows and, in part, will be apparent from the description, or may be learned by practice of example embodiments.

According to example embodiments, a method of transferring graphene may include forming a sacrificial layer and a graphene layer sequentially on a first substrate; bonding the graphene layer to a target layer; and removing the sacrificial layer using a laser to separate the first substrate from the graphene layer.

The sacrificial layer may include a material that shatters when a gas is generated by the laser. The gas may be at least one of hydrogen, oxygen, and nitrogen. A melting point of the sacrificial layer may be lower than that of a layer adjacent to the sacrificial layer. The sacrificial layer may be formed of at least one of TiN, TaN, AlN, WN, NiO, TiO$_2$, Ta$_2$O$_5$, ZnO, CeO$_2$, PZT, BTO, and LMO.

The laser may be irradiated to the sacrificial layer through the first substrate. The laser may be an excimer laser. The first substrate may be separated from the graphene layer while the first substrate is immersed in a deionized water (DI) solution.

The sacrificial layer and the graphene layer may be formed by forming the sacrificial layer on the first substrate, forming a catalyst layer on the sacrificial layer, and growing the graphene layer on the catalyst layer. A Gibbs free energy of the catalyst layer may be greater than that of the sacrificial layer. The method may further include removing the catalyst layer after the sacrificial layer is removed.

An insulating material may be formed on the graphene layer. The insulating material may be formed on the graphene layer before the graphene layer is bonded to the target layer. The insulating material may be formed on a surface of the target layer before the graphene layer is bonded to the target layer. The insulating material may be hydrogen-free. The target layer may include a second substrate and an insulating layer. The second substrate may include at least one of silicon, glass, plastic, quartz, sapphire, polymer, fused silica and stainless steel.

According to example embodiments, a method of manufacturing a device including graphene may include transferring the graphene layer to a second substrate using the method of transferring graphene, and forming a device including the graphene layer on the second substrate.

The method of manufacturing a device may further include patterning the graphene layer. The device may be any one of a sensor, a transistor, and a solar cell.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
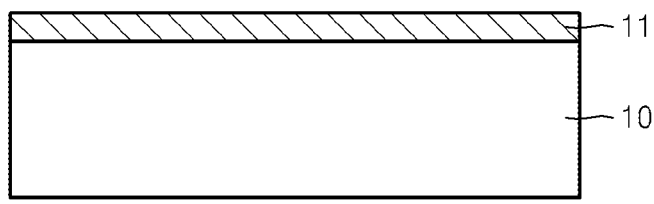
FIGS. 1A to 1H are perspective views illustrating methods of transferring graphene, according to example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In the drawings, the widths and thicknesses of layers and regions are exaggerated for clarity. It will also be understood that when a layer is referred to as being "on" another layer or substrate, it can be directly on the other layer or substrate, or intervening layers may also be present.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

The term "graphene" in this disclosure indicates that polycyclic aromatic molecules form a sheet in which a plurality of carbon atoms in the polycyclic aromatic molecules are interconnected with each other through covalent bonds. Graphene is also distinguished from a carbon nanotube having a cylindrical shape structure. The carbon atoms interconnected through the covalent bonds form a 6-membered ring as a basic repetition unit and may further include a 5-membered ring and/or a 7-membered ring. Accordingly, graphene looks like a single layer of covalently bonded carbon atoms, normally $sp^2$ bonded. Graphene may be formed of a single graphene layer or may be formed by laminating a plurality of graphene layers.

According to methods of transferring graphene according to example embodiments, a sacrificial layer and a graphene layer may be sequentially formed on a first substrate, and the graphene layer may be bonded to a target layer. The sacrificial layer may be removed by using a laser, and the first substrate may be separated from the graphene layer.

FIGS. 1A to 1H are perspective views illustrating methods of transferring graphene, according to example embodiments. Referring to FIG. 1A, a sacrificial layer 11 may be formed on a first substrate 10. The first substrate 10 is transparent and able to be processed at higher temperatures. For example, the first substrate 10 may include quartz, sapphire, or fused silica. The sacrificial layer 11 may be used for separating the first substrate 10 from a graphene layer 13 (see FIG. 1B) after the graphene layer 13 is bonded to a target layer. The sacrificial layer 11 may include materials which are selectively annealed in reaction to a laser. For example, the sacrificial layer 11 may include materials that may be shattered while a gas is generated, i.e., when the energy of the sacrificial layer 11 is greater than the ablation threshold energy in the laser annealing. The gas generated from the sacrificial layer 11 may be nitrogen ($N_2$), hydrogen ($H_2$), or oxygen ($O_2$).

Alternatively, the sacrificial layer 11 may include materials capable of being shattered by being irradiated with a laser and being rapidly fused or cooled because a melting point thereof is lower than that of an adjacent layer. For example, the sacrificial layer 11 may include 3-dimensional perovskite-type oxides (e.g., TiN, TaN, AlN, GaN, WN, PECVD SiO:H, a-Si:H, a-$Si_xGe1-_x$:H(0<x<1), AlO, ZnO, MgO, NiO, $CuO_2$, $W_2O_3$, $TiO_2$, $Ta_2O_5$, $CeO_2$, $Al_xN_y$:H, $SiO_xN_y$:H, PZT($PbZr_{1-x}Ti_xO_3$), BTO($BaTiO_3$), and/or LMO($LaMnO_3$).

Figure 1B:
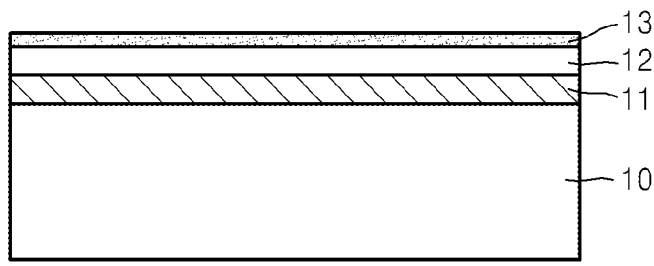

As illustrated in FIG. 1B, a catalyst layer 12 and the graphene layer 13 may be sequentially formed on the sacrificial layer 11. The catalyst layer 12 may be formed of at least one of a metal including, for example, Cu, Ni, Mo, Co, Pt, Ru, and a mixture thereof. This metal material may be formed by a deposition process using a sputtering apparatus, an e-beam evaporator, or a plating scheme, separately or compositely. In addition, the Gibbs free energy of a metal material may be greater than that of the catalyst layer 12. Accordingly, a reduction of the sacrificial layer 11 may be prevented or reduced. When reduced, the sacrificial layer 11 may not react to a laser.

The graphene layer 13 may be epitaxially grown. For example, the graphene layer 13 may be formed by using chemical vapor deposition (CVD). In detail, the first substrate 10 on which the sacrificial layer 11 and the catalyst layer 12 are formed, and a gas including carbon (e.g., $CH_4$, $C_2H_2$, $C_2H_4$, or CO) are put into a reactor for thermal CVD or inductively-coupled plasma chemical vapor deposition (ICP-CVD), and heated to cause the carbon to be absorbed into the catalyst layer 12. The carbon may be separated from the catalyst layer 12 by rapid cooling, and crystallized to grow the graphene layer 13. Besides, the graphene layer 13 may be formed by pyrolysis.

The graphene layer 13 may include one to ten graphene layers. That is, the graphene layer 13 may include a single layer or less than about ten laminated layers of the graphene layers.

Figure 1C:
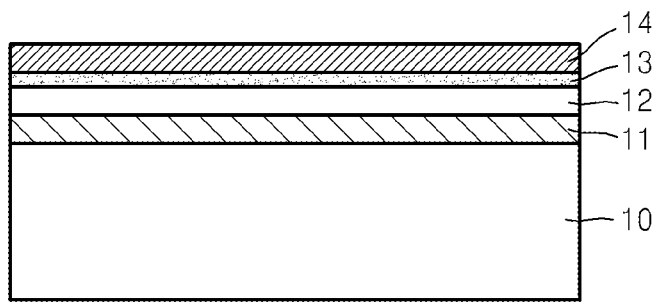

Also, as illustrated in FIG. 1C, a first insulating layer 14 may be formed on the graphene layer 13. The first insulating layer 14 may include, for example, $SiO_2$, or $AlO_x$. Because the graphene layer 13 is relatively weak to heat, the first insulating layer 14 may be formed at a lower temperature. The first insulating layer 14 may be formed by thermal oxidation, atomic layer deposition, or e-beam deposition. The first insulating layer 14 does not only cause the graphene layer 13 to be more easily bonded to a target layer when the graphene layer 13 is transferred onto the target layer, but also prevents or reduces foreign materials from penetrating into the graphene layer 13. Also, the first insulating layer 14 may be formed of a hydrogen-free insulating material. Accordingly, bonding may be easier.

Figure 1D:
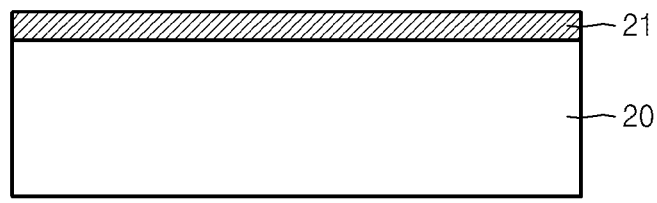

In addition, as illustrated in FIG. 1D, the target layer may be formed by disposing a second insulating layer 21 on a second substrate 20. The second substrate 20 may be formed of silicon, glass, plastic, quartz, sapphire and fused silica, and/or polymer, have an additional insulating material thereon, or may be a semiconductor (e.g., c-Si, a-Si, and/or poly-Si). Besides, the second substrate 20 may be formed of a conduction material. Also, an insulating material of the second insulating layer 21 may be a hydrogen-free material. The insulating material of the second insulating layer 21 may be equal to or different from the insulating material of the first insulating layer 14. The second insulating material 21 may be also formed on the second substrate 20 by thermal oxidation, atomic layer deposition, or e-beam deposition.

Figure 1E:
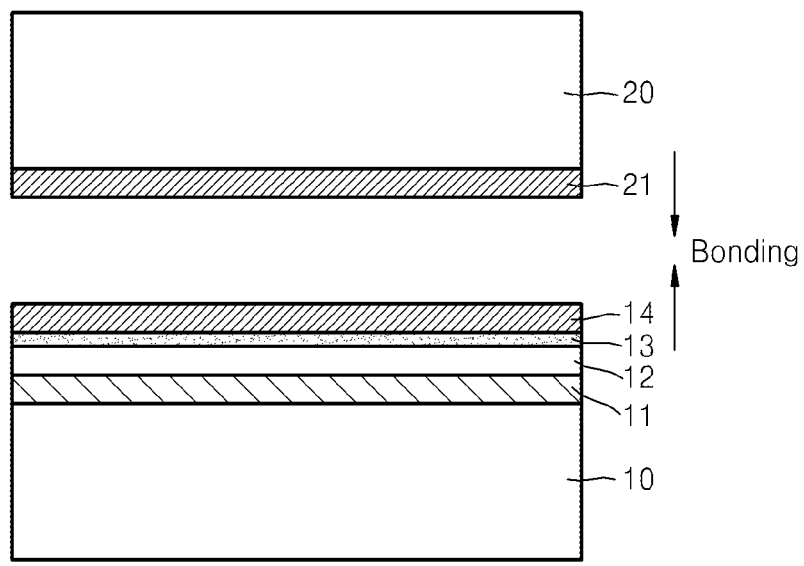

As illustrated in FIG. 1E, the first substrate 10 having the first insulating layer 12 thereon and the second substrate 20 having the second insulating layer 21 thereon may be bonded together. The first substrate 10 and the second substrate 20 may be bonded together by bonding the first insulating layer 12 and the second insulating layer 21 together when the first insulating layer 12 and the second insulating layer 21 face each other. The bonding may be performed at room temperature or at a higher temperature. When the bonding is performed at a higher temperature, the temperature may be about 800° C. to about 900° C. The bonding may take place by adhesion without pressure or with force of about 5000 kgf.

Figure 1F:
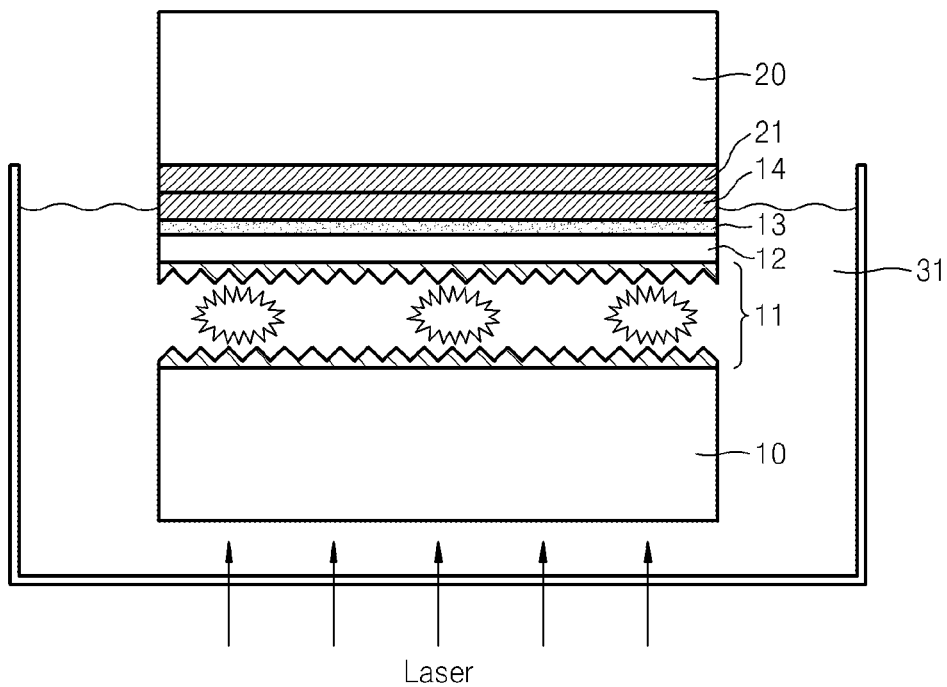

In addition, as illustrated in FIG. 1F, the first substrate 10 is separated from the graphene layer 13 by irradiating a laser to the sacrificial layer 11 once the first insulating layer 14 and the second insulating layer 21 are bonded. The laser may an excimer laser. The laser may be a gas laser using molecules referred to as an excimer (e.g., ArF, KrF, or XeCl). The above-described laser may be irradiated to the sacrificial layer 11 through the first substrate 10. When the sacrificial layer 11 is irradiated with the laser and annealed, the sacrificial layer 11 shatters and the first substrate 10 is separated from the second substrate 20 with the sacrificial layer 11 as the center. Because the first and second substrates 10 and 20 may be separated from each other by uniformly irradiating the laser to the sacrificial layer 11, graphene transferring is possible.

In addition, particles may be created when the sacrificial layer 11 shatters. In order to minimize or reduce contamination of the graphene layer 13, the second insulating layer 21, and the second substrate 20, a separation process for the first and second substrates 10 and 20 may be performed within a deionized water (DI) solution 31. For example, after the bonded first and second substrates 10 and 20 are immersed in a container containing the DI solution 31, the sacrificial layer 11 may be irradiated with the laser. The catalyst layer 12 may be removed. Because the sacrificial layer 11 is removed by the laser, a surface of the sacrificial layer 11 is entirely exposed to the external environment. Thus, the catalyst layer 12 may be more easily removed.

Figure 1G:
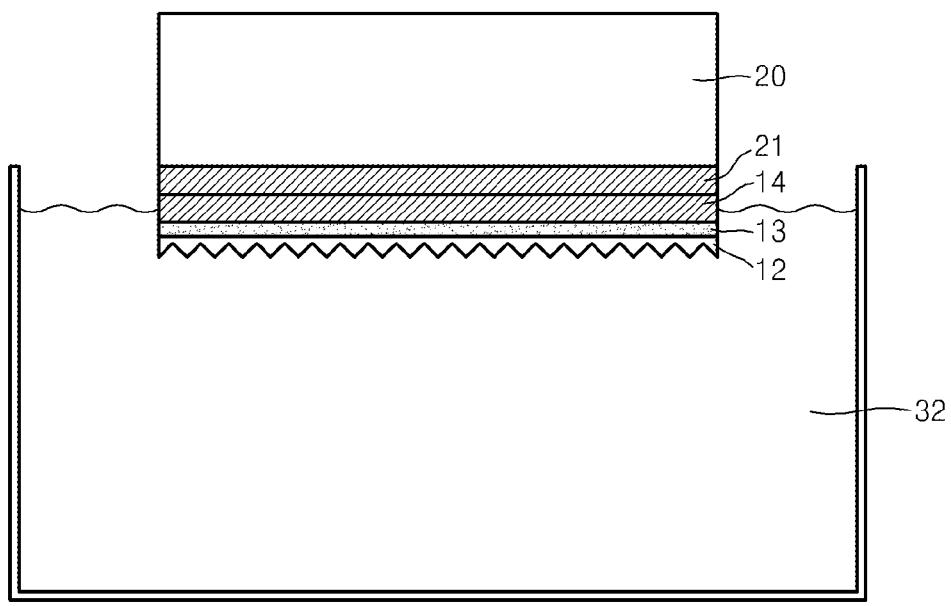
Figure 1H:
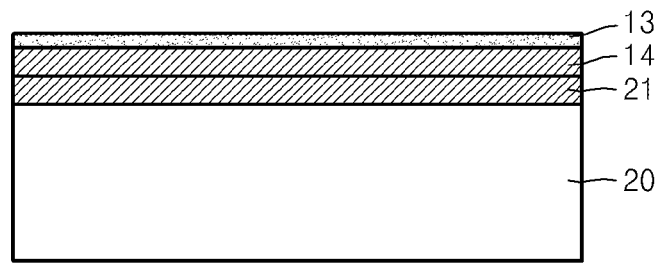

As illustrated in FIG. 1G, the catalyst layer 12 may be removed by a wet etching process. A solution 32 may be determined according to a metal material forming the catalyst layer 12. For example, when the catalyst layer 12 is formed of Cu, an acid etchant (e.g., $FeCl_3$) may be used as the solution 32. Through this process, as illustrated in FIG. 1H, a structure of an insulating layer including the first insulating layer 14, the second insulating layer 21 and the substrate 20 having the graphene layer 13 thereon may be obtained. The graphene layer 13 on an insulating layer, as illustrated in FIG. 1G, shows a reverse phase of the same after the catalyst layer 12 is removed in FIG. 1F. However, the method of removing the catalyst layer 12 is not limited to the wet etching and may be performed by other methods. Eventually, the graphene layer 13 formed over the first substrate 10 (see FIG. 1B) is transferred or transitioned onto the second substrate 20.

Through this method, the graphene layer 13 may be disposed on an insulating layer. In example embodiments, the graphene layer 13 is transferred onto an insulating layer by bonding the first and second insulating layers 14 and 21 together after the second insulating layer 21 is formed on the second substrate 20, which is not limited hereto. When the second substrate 20 is formed of an insulating material, the graphene layer 13 may be transferred onto the second substrate 20 by bonding the first insulating layer 14 to the second substrate 20. Also, the graphene layer 13 may be formed on the second insulating layer 21 or the second substrate 20 formed of an insulating material without the first insulating layer 14 interposed therebetween. In addition, the graphene layer 13 may be transferred onto a patterned insulating layer.

Also, a third insulating layer (not shown), which isolates heat, may be additionally laminated on a sacrificial layer before a catalyst layer is laminated on the sacrificial layer, as shown in FIG. 1B. The third insulating layer may be formed of $SiO_2$. The third insulating layer may prevent or reduce heat created by a laser from being transferred onto the catalyst layer and the graphene layer, when the sacrificial layer is irradiated with the laser. Namely, the third insulating layer may alleviate the thermal impact on the catalyst layer and the graphene layer or prevent or reduce dispersion of the sacrificial layer and the catalyst layer due to higher temperatures.

In addition, in FIG. 1F, the first substrate 10 is arranged below the second substrate 20 in the DI solution 32 and the laser is irradiated from below the first substrate 10, but it is not limited thereto. The first substrate 10 may be disposed over the second substrate 20 and the laser may be irradiated from above and towards the first substrate 10. The laser may be irradiated even in a state where the first substrate 10 is arranged in an upper side and the edges of the first substrate 10 are surrounded with the DI solution 32. In example embodiments, the creation of the particles may be also suppressed.

The transferred graphene layer 13 as described above may be used for manufacturing a device to which graphene is applied. For example, after the graphene layer 13 is patterned in a predetermined or given shape, various devices including the patterned graphene 13 on a substrate may be manufactured.

Graphene may be usefully adopted as a transparent electrode due to improved conductivity and relatively high film uniformity. In a solar cell, an electrode is used on a substrate, and the electrode is transparent due to the necessity of a light-transmitting property. Graphene used as the transparent electrode shows improved conductivity. When graphene is used as a panel conductive thin film of various display devices, a desired conductivity may be achieved even with a relatively small amount thereof, and thus, light transmission may be improved.

Figure 2:
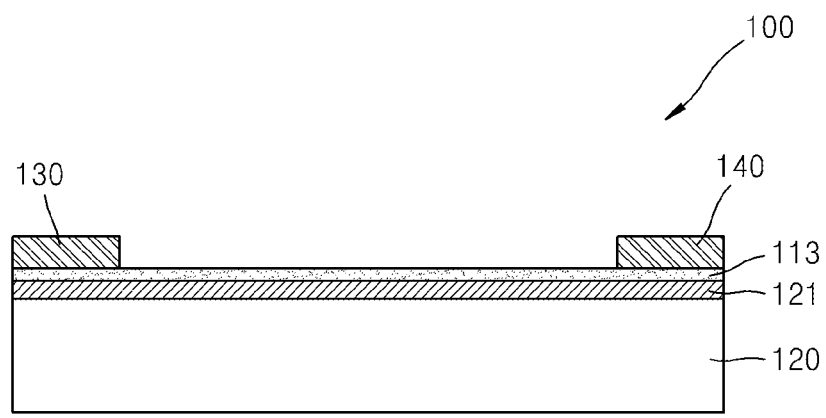
FIG. 2 illustrates a structure of a graphene device manufactured by methods of transferring graphene, according to example embodiments.

Graphene may also be used in a channel for a memory device, sensor, or electronic paper. FIG. 2 illustrates a structure of a graphene device 100 manufactured by the graphene transfer method according to example embodiments.

After a process of FIG. 1H, a first electrode 130 and a second electrode 140 may be further formed on the graphene layer 113, the graphene layer being transferred onto the second substrate 120 and the second insulating layer 121. Thus, the graphene device 100 of FIG. 2 may be manufactured. The graphene device 100 may be applied as a sensor. For example, a graphene layer 113 plays a role of a sensor and an electrical characteristic change due to the adsorption of predetermined or given materials may be measured from the first and second electrodes 130 and 140.

In addition, graphene may be used in various electrical devices (e.g., a sensor, a bipolar junction transistor, a field effect transistor, a heterogeneous bipolar transistor, a single electron transistor, a light-emitting diode, and/or an organic electroluminescent diode). In these kinds of devices, graphene may be used as a channel layer, an electrode, or a buffer layer between the electrode and the channel layer.

Figure 3:
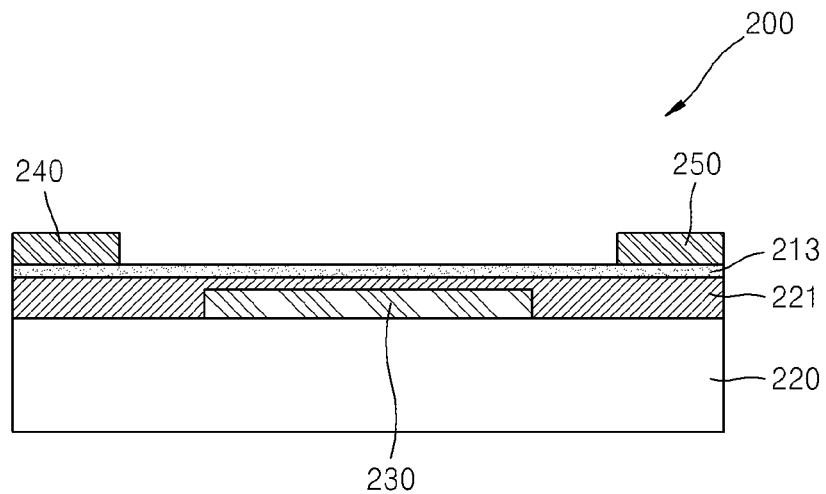
FIG. 3 illustrates a structure of a graphene device manufactured by methods of transferring graphene, according to example embodiments.

FIG. 3 illustrates a structure of a graphene device 200 manufactured by the method of transferring graphene according to example embodiments.

In the process of FIG. 1D, a structure having a gate electrode 230 formed on a second substrate 220 and a second insulating layer 221 covering the gate electrode 230 may be used, and a graphene layer 213 of FIG. 1C may be transferred onto the second insulating layer 221. In addition, the graphene device 200 as shown in FIG. 3 may be manufactured by further forming a source electrode 240 and a drain electrode 250 on the graphene layer 213. The graphene device 200 may be a transistor where the graphene layer 213 plays a role of a channel layer. For the transistor, a light-emitting device is electrically connected to the transistor, and the light-emitting device may be controlled by using a current flowing between a source and a drain. As a result, a flat panel display may be formed.

Figure 4:
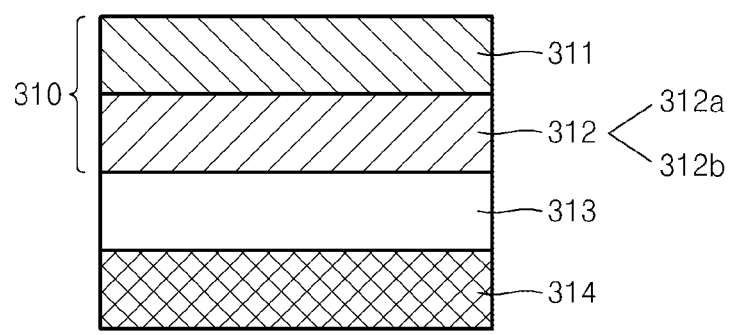
FIG. 4 illustrates a structure of a solar cell including graphene prepared by methods of transferring graphene, according to example embodiments.

In addition, a solar cell may be manufactured by using graphene on an insulating layer. FIG. 4 illustrates a structure of a solar cell including graphene prepared by the method of transferring graphene according to embodiments.

The solar cell illustrated in FIG. 4 may be a dye-sensitized solar cell. The dye-sensitized solar cell includes a semiconductor electrode 310, an electrolyte layer 313, and an opposite electrode 314. The semiconductor electrode 310 is formed of a conductive transparent substrate 311 and a light absorption layer 312. The semiconductor electrode 310 may be completed by coating a colloidal solution of oxide nanoparticles 312a on a conductive glass substrate, heating the same in a high temperature electric furnace, and adsorbing a dye 312b thereon. As the conductive transparent substrate 311, a transparent electrode including the graphene on an insulating substrate may be used. The transparent electrode may be obtained by preparing the graphene on the insulating substrate according to the above-described manufacturing process. As the insulating substrate, a glass substrate or transparent polymer materials (e.g., polyethylene terephthalate, polycarbonate, polyimide, or polyethylene naphthalate) may be used, which may also apply to the opposite electrode 314.

In order to make the dye-sensitized solar cell have a foldable structure, for example, a cylindrical shape structure, the opposite electrode as well as the transparent electrode may be flexible.

The oxide nanoparticles 312a used in the solar cell are semiconductor fine particles, and may be an n-type semiconductor where electrons in the conduction band become carriers under optical excitation and provide anode current. In detail, the oxide nanoparticles 312a may be one of $TiO_2$, $SnO_2$, $ZnO_2$, $WO_3$, $Nb_2O_5$, $Al_2O_3$, MgO, and $TiSrO_3$, and may be anatase type $TiO_2$. However, the oxide nanoparticles 312a are not limited thereto, and may be used solely or as any mixture of two or more of them. The semiconductor fine particles may have a relatively large surface area, so that a dye adsorbed thereon absorbs a larger amount of light. For this, particle sizes of the semiconductor fine particles may be smaller than about 20 nm or less.

As the dye 312b, a dye which is used in the solar cell field or the photoelectric cell field may be used without limitation, and may be a ruthenium complex. As the ruthenium complex, $RuL_2(SCN)_2$, $RuL_2(H_2O)2$, $RuL_3$, and/or $RuL_2$ (here, L denotes 2, 2'-bipyridyl-4,4'-decarboxlate) may be used. However, as the dye 312b, a dye having a charge separation function and a sensitized reaction may be used without any particular limitation. Besides the ruthenium complex, a xanthene type pigment (e.g., rhodamine B, rose bengal, eosin, and erythrosine), a cyanine type pigment (e.g., kinocyanine and cryptocyanine), a basic dye (e.g., phenosafranine, cabri blue, thiosine, and methylene blue), a porphyrin type compound (e.g., chlorophyll, zinc-porphyrin, and magnesium porphyrin), a complex compound (e.g., azo pigment, phthalocyanine compound, Ru-trisbipyridyl, an anthraquinone type pigment, and polycyclic quinone type pigment).

The thickness of the light absorption layer 312, including the oxide nanoparticles 312a and the dye 312b, may be about 15 microns or less, for example, about 1 micron to about 15 microns, because the light absorption layer 312 has relatively large series resistance and an increase of the series resistance thereof results in deterioration of conversion efficiency. Accordingly, a film thickness of about 15 microns or less may maintain the series resistance to be relatively low and the function thereof constant, and prevent or reduce deterioration of conversion efficiency.

The electrolyte layer 313 used in the dye-sensitized solar cell may be formed of liquid electrolyte, ionic liquid electrolyte, ionic gel electrolyte, polymer electrolyte, and a complex thereof. The electrolyte layer 313 may be representatively formed of an electrolyte, include the light absorption layer 312, or have the electrolyte immersed in the light absorption layer 312. As the electrolyte, for example, an acetonitrile solution of iodine may be used. However, the electrolyte is not limited thereto, and any solution having a hole conduction function may also be used.

In addition, the dye-sensitized solar cell may further include a catalyst layer (not shown) in order to expedite an oxidation-reduction reaction of the dye-sensitized solar cell. The catalyst layer may include platinum, graphite, carbon nanotube, carbon black, a p-type semiconductor, and a complex thereof, and be disposed between the electrolyte layer 313 and the opposite electrode 314. The catalyst layer may have a relatively fine structure whose surface area is increased. For example, in the case of platinum, a platinum black state may be proper. In the case of carbon, a porous state may be proper. The platinum black may be formed by platinum anodizing or chloroplatinic acid treatment. The porous carbon may be formed by sintering carbon fine particles or baking an organic polymer.

The foregoing dye-sensitized solar cell may have improved light efficiency and processability by adopting a transparent electrode including graphene having improved conductivity.

In addition, after a graphene layer transferred onto a second substrate is patterned in a predetermined or given shape, various devices including the patterned graphene layer may be manufactured. A method of manufacturing a device using the transferred graphene layer may include patterning the graphene layer, and forming a predetermined or given device including the patterned graphene layer. Also, an insulating material may not be formed completely on the graphene layer, but may be formed on a portion of the graphene layer, depending on the type of device.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A method of transferring graphene, the method comprising:
    forming a sacrificial layer and a graphene layer sequentially on a first substrate;
    bonding the graphene layer to a target layer; and
    removing the sacrificial layer using a laser to separate the first substrate from the graphene layer,
    wherein the removing entirely removes the sacrificial layer.

2. The method according to claim 1, wherein the removing the sacrificial layer includes removing the sacrificial layer made of a material that shatters when a gas is generated by the laser.

3. The method according to claim 2, wherein the removing the sacrificial layer includes removing the sacrificial layer made of a material that shatters when at least one of hydrogen, oxygen, and nitrogen is generated by the laser.

4. The method according to claim 1, wherein the forming the sacrificial layer forms the sacrificial layer having a melting point lower than that of a layer adjacent to the sacrificial layer.

5. The method according to claim 1, wherein the forming the sacrificial layer forms at least one of TiN, TaN, AlN, WN, NiO, $TiO_2$, $Ta_2O_5$, ZnO, $CeO_2$, PZT, BTO, and LMO.

6. The method according to claim 1, wherein the removing irradiates the sacrificial layer through the first substrate.

7. The method according to claim 1, wherein the removing uses an excimer laser.

8. The method according to claim 1, wherein the removing separates the first substrate from the graphene layer while the first substrate is immersed in a deionized water (DI) solution.

9. The method according to claim 1, wherein the forming a sacrificial layer and a graphene layer comprises:
    forming the sacrificial layer on the first substrate;
    forming a catalyst layer on the sacrificial layer; and
    growing the graphene layer on the catalyst layer.

10. The method according to claim 9, further comprising:
    removing the catalyst layer after the removing the sacrificial layer.

11. The method according to claim 9, wherein the forming the catalyst layer forms the catalyst layer having a Gibbs free energy value greater than that of the sacrificial layer.

12. The method according to claim 1, wherein the forming the sacrificial layer and the graphene layer includes forming an insulating material on the graphene layer.

13. The method according to claim 12, wherein the forming the insulating material forms the insulating material on the graphene layer before the bonding.

14. The method according to claim 12, wherein the forming the insulating material forms the insulating material on a surface of the target layer before the bonding.

15. The method according to claim 12, wherein the forming the insulating material forms a hydrogen-free insulating material.

16. The method according to claim 12, wherein the bonding the graphene layer to the target layer includes bonding the graphene layer to the target layer including a second substrate and an insulating layer.

17. The method according to claim 16, wherein the bonding the graphene layer to the target area includes bonding the graphene layer to the target layer including the insulating layer and at least one of silicon, glass, plastic, quartz, sapphire, polymer, fused silica, and stainless steel.

18. A method of manufacturing a device including graphene, the method comprising:
    transferring the graphene layer to a second substrate according to the method of claim 1; and
    forming a device including the graphene layer on the second substrate.

19. The method according to claim 18, further comprising:
    patterning the graphene layer.

20. The method according to claim 18, wherein the device is one of a sensor, a transistor, and a solar cell.

* * * * *